United States Patent
Takahashi

(10) Patent No.: US 10,475,938 B2
(45) Date of Patent: Nov. 12, 2019

(54) PROCESS FOR PRODUCING CONDUCTIVE PASTES FOR FORMING SOLAR CELL ELECTRODES

(71) Applicant: NAMICS CORPORATION, Niigata-shi, Niigata (JP)

(72) Inventor: Tetsu Takahashi, Niigata (JP)

(73) Assignee: NAMICS CORPORATION, Niigata-shi (JP)

(*) Notice: Subject to any disclaimer, the term of this patent is extended or adjusted under 35 U.S.C. 154(b) by 107 days.

(21) Appl. No.: 15/331,005

(22) Filed: Oct. 21, 2016

(65) Prior Publication Data
US 2017/0040472 A1 Feb. 9, 2017

Related U.S. Application Data

(62) Division of application No. 13/898,610, filed on May 21, 2013.

(30) Foreign Application Priority Data

May 22, 2012 (JP) ................................. 2012-116293

(51) Int. Cl.
*H01L 31/0224* (2006.01)
*H01L 31/0256* (2006.01)
(Continued)

(52) U.S. Cl.
CPC ........ *H01L 31/022441* (2013.01); *C03C 4/14* (2013.01); *C03C 8/10* (2013.01);
(Continued)

(58) Field of Classification Search
CPC ........................................ H01L 31/02–022425
See application file for complete search history.

(56) References Cited

U.S. PATENT DOCUMENTS

2004/0055635 A1* 3/2004 Nagakubo ................. C03C 8/10
  136/261
2006/0102228 A1* 5/2006 Sridharan ................. C03C 3/07
  136/256
(Continued)

FOREIGN PATENT DOCUMENTS

JP 2008109016 A 5/2008
JP 2009193993 A 8/2009
(Continued)

OTHER PUBLICATIONS

Kim et al., "Effect of Bismate Frits Under Fast Firing on Reactions Between Ag Electrodes and Si Wafer for Si Solar Cell", Mar. 2013.*
(Continued)

*Primary Examiner* — Niki Bakhtiari
(74) *Attorney, Agent, or Firm* — Holtz, Holtz & Volek PC

(57) ABSTRACT

A process for producing conductive pastes for forming solar cell electrodes, including a step of measuring binding energies of oxygen in a glass frit by X-ray photoelectron spectroscopy, a step of selecting a glass frit providing an X-ray photoelectron spectrum representing binding energies of oxygen in which the signal intensity of a peak with a peak top at a range from 529 eV to less than 531 eV has a proportion of 40% or more relative to the total of signal intensities from 526 eV to 536 eV, and a step of mixing together a conductive powder, the glass frit and an organic vehicle.

19 Claims, 3 Drawing Sheets

(51) Int. Cl.
- *H01L 31/18* (2006.01)
- *H01L 31/068* (2012.01)
- *C03C 4/14* (2006.01)
- *C03C 8/10* (2006.01)
- *C03C 8/18* (2006.01)
- *C09D 5/24* (2006.01)

(52) U.S. Cl.
CPC .................. *C03C 8/18* (2013.01); *C09D 5/24* (2013.01); *H01L 31/0224* (2013.01); *H01L 31/0256* (2013.01); *H01L 31/022425* (2013.01); *H01L 31/068* (2013.01); *H01L 31/1804* (2013.01); *H01L 31/1884* (2013.01); *C03C 2204/00* (2013.01); *C03C 2205/00* (2013.01); *Y02E 10/547* (2013.01); *Y02P 70/521* (2015.11)

(56) References Cited

U.S. PATENT DOCUMENTS

| | | |
|---|---|---|
| 2009/0104461 A1 | 4/2009 | Young et al. |
| 2011/0120535 A1 | 5/2011 | Prince et al. |
| 2011/0192457 A1* | 8/2011 | Nakayama ............... H01B 1/22 136/256 |
| 2011/0309312 A1 | 12/2011 | Sugiyama et al. |

FOREIGN PATENT DOCUMENTS

| | | |
|---|---|---|
| JP | 2009231826 A | 10/2009 |
| JP | 2010199334 A | 9/2010 |
| JP | 2010263136 A | 11/2010 |
| JP | 2011502330 A | 1/2011 |
| JP | 2011502345 A | 1/2011 |
| JP | 2011503772 A | 1/2011 |
| JP | 2011066134 A | 3/2011 |
| JP | 2011086754 A | 4/2011 |
| JP | 2011171272 A | 9/2011 |
| WO | 2009052266 A1 | 4/2009 |
| WO | 2009052271 A1 | 4/2009 |
| WO | 2009052364 A1 | 4/2009 |
| WO | 2009139222 A1 | 11/2009 |

OTHER PUBLICATIONS

Japanese Office Action (and English translation thereof) dated Feb. 23, 2016, issued in counterpart Japanese Application No. 2012-116293.

* cited by examiner

PROCESS FOR PRODUCING CONDUCTIVE PASTES FOR FORMING SOLAR CELL ELECTRODES

CROSS-REFERENCE TO RELATED APPLICATIONS

This is a Divisional application of U.S. application Ser. No. 13/898,610, filed May 21, 2013 (abandoned), the entire contents of which are incorporated herein by reference.

FIELD OF THE INVENTION

The present invention relates to conductive pastes for forming solar cell electrodes, in particular conductive pastes for forming front or back electrodes in crystalline silicon solar cells utilizing crystalline silicon such as monocrystalline silicon and polycrystalline silicon as substrates, to processes for manufacturing solar cells using the conductive pastes for forming an electrode, and to solar cells manufactured by the processes.

BACKGROUND OF THE INVENTION

There has recently been a marked increase in the production of crystalline silicon solar cells which utilize plates of monocrystalline or polycrystalline silicon as substrates. Such solar cells have electrodes for output of the generated power.

As an example, a schematic cross sectional view of a crystalline silicon solar cell is illustrated in FIG. 1. In a crystalline silicon solar cell, an n-type diffusion layer (an n-type silicon layer) 3 is generally formed on the light incident side of a p-type crystalline silicon substrate 4. An antireflection film 2 is formed on the n-type diffusion layer 3. Further, a light incident-side electrode 1 is formed by a series of steps in which a conductive paste is applied by a method such as screen printing to print a pattern corresponding to the light incident-side electrode 1 (the front electrode) on the antireflection film 2, and the conductive paste is dried and fired. During firing, the conductive paste fires through the antireflection film 2 with the result that the light incident-side electrode 1 comes to be in contact with then-type diffusion layer 3. Here, fire through is the etching of the insulating antireflection film with materials such as glass frits present in the conductive paste so as to conductively connect the light incident-side electrode 1 and the n-type diffusion layer 3. Because light does not have to come through the backside of the p-type silicon substrate 4, a back electrode 5 is generally formed substantially over the backside entirely. The p-type silicon substrate 4 and the n-type diffusion layer 3 form a p-n junction at their interface. Light such as sunlight passes through the antireflection film 2 and the n-type diffusion layer 3 and enters into the p-type silicon substrate 4. The light is absorbed during this process, generating electron-hole pairs. The electric field at the p-n junction separates the electron-hole pairs, the electrons being attracted to the light incident-side electrode 1 and the holes to the back electrode 5. The electrons and the holes are output as electric current through these electrodes.

Conventionally, for the formation of electrodes of solar cells, in particular crystalline silicon solar cells, conductive pastes which contain conductive powders, glass frits, organic binders, solvents and other additives, are used. A silver powder is mainly used as the conductive powder.

For example, Patent Publication 1 (JP 2009-193993 A) discloses a process for manufacturing a solar cell electrode wherein the electrode is formed on a main surface of a silicon substrate of a solar cell and a wire for output of the power generated in the silicon substrate is connected to an upper portion of the electrode via a solder, the process comprising a step (a) of printing a first silver paste which includes a glass frit containing lead oxide and bismuth oxide onto the main surface of the silicon substrate, a step (b) of printing a second silver paste onto the first silver paste, the second silver paste including a glass frit having lower contents of lead oxide and bismuth oxide than in the glass frit of the first silver paste, and a step (e) of firing the first silver paste and the second silver paste.

Patent Publication 2 (JP 2008-109016 A) discloses a silver paste for solar cell elements comprising a glass frit having a composition containing, in terms of oxide, 5 wt % to 10 wt % of zinc oxide, 70 wt % to 84 wt % of bismuth oxide, and 6 wt % or more of boron oxide and silicon oxide combined, as well as a silver powder and an organic vehicle.

Patent Publication 3 (JP 2011-503772 A) discloses a silicon semiconductor device, and a conductive silver paste for use in the front side of a solar cell device. In detail, Patent Publication 3 discloses a thick film composition comprising a) an electrically conductive silver powder; b) one or more glass frits; and c) (a) Mg and (b) a specific Mg-containing additive, d) dispersed in an organic medium. Patent Publication 3 describes that the glass frit comprises $Bi_2O_3$ and $B_2O_3$ at 8 to 25 wt % of the glass frit, and further comprises one or more components selected from the group consisting of $SiO_2$, $P_2O_5$, $GeO_2$ and $V_2O_5$.

Patent Publication 4 (JP 2011-502345 A) and Patent Publication 5 (JP 2011-502330 A) disclose thick film compositions comprising glass frits similar to those of Patent Publication 3.

Patent Publication 6 (JP 2011-171272 A) discloses an electrode paste composition comprising copper-containing particles exhibiting the largest exothermic peak at a peak top temperature of 280° C. or more according to thermogravimetric and differential thermal analysis, glass particles, a solvent and a resin. Patent Publication 6 describes that the glass particles have a glass softening point of 600° C. or less and a crystallization onset temperature exceeding 600° C.

Patent Publication 7 (WO 2009/139222 A) discloses a solar cell comprising a semiconductor substrate with a p-n junction, and a silver electrode and an aluminum electrode on the backside of the semiconductor substrate, the silver electrode and the aluminum electrode overlapping with each other at portions, the silver electrode containing a glass component having a glass softening temperature equal to or higher than the glass softening temperature of a glass component in the aluminum electrode.

Patent Publication 8 (JP 2011-066134 A) discloses a silver paste for forming solar cell silver electrodes which comprises silver particles, a polyvinyl acetal resin, a glass frit and an organic solvent, the content of the silver particles being 70 to 95 wt %, the content of the polyvinyl acetal resin being 0.1 to 5 wt %, the content of the glass frit being 0.1 to 5 wt %. Patent Publication 8 describes that a lead borosilicate glass frit having a softening temperature of 300° C. or more and not more than the firing temperature (for example, 800° C.) is used as the glass frit. Patent Publication 8 also describes that the lower and upper limits of the glass frit content are 0.1 wt % and 5 wt %, respectively, relative to the paste.

Patent Publication 9 (JP 2010-263136 A) discloses an electrode conductively connected to a semiconductor substrate that is a sintered body comprising silver particles and a glass frit, the silver particles containing 50 to 80 mass % of particles with an average particle diameter of 10 μm or more. Patent Publication 9 describes that the sintered body may be obtained by sintering a silver paste including the silver particles, the glass frit, an organic vehicle and an organic solvent. Patent Publication 9 also describes that this silver paste preferably contains 55 to 90 mass %, particularly 75 to 85 mass % of the silver particles, and 0.2 to 5 mass %, particularly 0.5 to 2 mass % of the glass frit.

Patent Publication 10 (JP 2009-231826 A) discloses a conductive composition comprising a silver powder, a glass powder containing PbO, and an organic vehicle, the composition being used to form an electrode conductively connected to an n-type semiconductor layer through a silicon nitride layer, the n-type semiconductor layer being disposed under the silicon nitride layer, the content of the silver powder in the composition being 70 mass % to 95 mass %, the content of the glass powder being 1 to 10 parts by mass with respect to 100 parts by mass of the silver powder, the glass powder having a basicity of 0.6 to 0.8 and a glass transition temperature of 300° C. to 450° C.

Patent Publication 1: JP 2009-193993 A
Patent Publication 2: JP 2008-109016 A
Patent Publication 3: JP 2011-503772 A
Patent Publication 4: JP 2011-502345 A
Patent Publication 5: JP 2011-502330 A
Patent Publication 6: JP 2011-171272 A
Patent Publication 7: WO 2009/139222 A
Patent Publication 8: JP 2011-066134 A
Patent Publication 9: JP 2010-263136 A
Patent Publication 10: JP 2009-231826 A

BRIEF SUMMARY OF THE INVENTION

Reducing the electrical resistance (the contact resistance) between a front electrode and an n-type diffusion layer of crystalline silicon is an important task in order to obtain crystalline silicon solar cells having high conversion efficiency. It is known that glass frits in conductive pastes for the formation of solar cell electrodes play an important role in the reduction, of contact resistance.

Reducing the contact resistance has been attempted by selecting the types and compositions of oxides that constitute glass frits as described in Patent Publications 1 to 5. Another approach is to control the softening point of glass frits to specific temperatures as described in Patent Publications 6 and 7. Alternatively, as described in Patent Publication 8, the content of glass frits is regulated to be within the specific range. A still another approach is to adopt specific types and contents of oxides that constitute glass frits as described in Patent Publication 9.

However, for the selection of appropriate glass frits, much trial and error due to the need of manufacturing and evaluating prototype solar cells utilizing a large variety of conductive pastes containing various kinds of oxides in various mixing ratios, is necessary. Since manufacturing a large variation of prototype solar cells using conductive pastes with various conditions needs complicated and troublesome efforts, the development cost is increased.

It is a known fact in the art that solar cell characteristics are affected by the types of glass frits in conductive pastes which form front electrodes. However, detailed approach to how the glass frits should be selected is unknown. Although the Patent Publications mentioned above describe glass frits having various compositions, there are no explicit mentions regarding the reasons why the compositions of glass frits are selected. That is, there have been no sufficient guidelines in the art which indicate what compositions the glass frits should have in order to realize electrodes with low contact resistance.

It is therefore an object of the present invention to provide guidelines for the selection of appropriate composition of glass frits and thereby to obtain a conductive paste for forming a solar cell electrode, in detail, a conductive paste for forming a satisfactory solar cell electrode on an n-type silicon layer in a crystalline solar cell. It is another object of the invention to obtain a conductive paste which can fire through an antireflection film made of material such as silicon nitride when the conductive paste is fired.

The present inventors have found that conductive pastes for forming solar cell electrodes have a strong correlation between the oxidation state of glass frits and the fill factor (FF) of solar cell characteristics. The present inventors have further found that the oxidation state affects fire through properties with respect to insulating films such as silicon nitride films used as antireflection films and passivation films as well as affects the reactivity of the electrodes with silicon in the emitter layers (n-type silicon layers) after the firing of electrodes through the insulating films. A correlation between the oxidation state of glass frits and the fill factor (FF) of solar cell characteristics is considered to be a more essential factor for obtaining satisfactory solar cell characteristics than the conventional selection of glass frits by trial and error. The oxidation state of glass frits may be identified by an XPS method.

The present inventors have completed the present invention based on the above findings. The present invention has the following configurations.

An aspect of the invention is directed to a process for manufacturing solar cells comprising the steps of printing a conductive paste onto an n-type silicon layer of a crystalline silicon substrate or onto an antireflection film on the n-type silicon layer, and drying and firing the conductive paste to form an electrode, the conductive paste comprising a conductive powder, a glass frit and an organic vehicle, the glass frit comprising at least one oxide, X-ray photoelectron spectroscopy of the glass frit giving a spectrum representing binding energies of oxygen in which the signal intensity of a peak with a peak top at a range from 529 eV to less than 531 eV has a proportion of 40% or more relative to the total of signal intensities from 526 eV to 536 eV. By the use of the specific conductive paste, the inventive solar cell manufacturing process can produce solar cells having good solar cell characteristics.

Another aspect of the invention is directed to a solar cell manufactured by the above process for manufacturing solar cells. The solar cell of the invention has good solar cell characteristics.

An aspect of the invention is directed to a conductive paste for forming solar cell electrodes comprising a conductive powder, a glass frit and an organic vehicle, the glass frit comprising at least one oxide, X-ray photoelectron spectroscopy of the glass frit giving a spectrum representing binding energies of oxygen in which the signal intensity of a peak with a peak top at a range from 529 eV to less than 531 eV has a proportion of 40% or more relative to the total of signal intensities from 526 eV to 536 eV. The inventive conductive paste can form solar cell electrodes that allow solar cells to exhibit good solar cell characteristics. During firing, the inventive conductive paste can fire through antireflection films made of materials such as silicon nitride.

An aspect of the invention is directed to a process for producing conductive pastes for forming solar cell electrodes, comprising a step of measuring binding energies of oxygen in a glass frit by X-ray photoelectron spectroscopy, a step of selecting a glass frit giving an X-ray photoelectron spectrum representing binding energies of oxygen in which the signal intensity of a peak with a peak top at a range from 529 eV to less than 531 eV has a proportion of 40% or more relative to the total of signal intensities from 526 eV to 536 eV, and a step of mixing a conductive powder, the glass frit and an organic vehicle together.

The inventive process for producing conductive pastes for forming solar cell electrodes provides guidelines for the selection of an appropriate composition of a glass frit in the production of conductive pastes for forming solar cell electrodes. Thus, it becomes possible to produce conductive pastes which can form satisfactory solar cell electrodes on n-type silicon layers of crystalline solar cells. According to the invention, conductive pastes can be obtained which can fire through antireflection films made of materials such as silicon nitride when the conductive pastes are fired. Conductive pastes obtained by the inventive production process can form solar cell electrodes that allow solar cells to exhibit good solar cell characteristics.

DETAILED DESCRIPTION OF THE INVENTION

Figure 1:
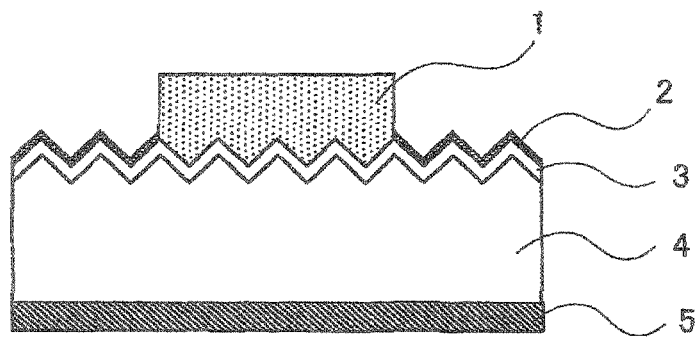
FIG. 1 is a schematic cross sectional view of a portion of a crystalline silicon solar cell in the vicinity of a front electrode.

The present invention may have the following configurations.

A conductive paste for forming solar cell electrodes according to the invention comprises a conductive powder, a glass frit and an organic vehicle. The glass frit comprises at least one oxide. X-ray photoelectron spectroscopy of the glass frit gives a spectrum representing binding energies of oxygen in which the signal intensity of a peak with a peak top at a range from 529 eV to less than 531 eV has a proportion of 40% or more relative to the total of signal intensities from 526 eV to 536 eV. The inventive conductive paste can form solar cell electrodes that allow solar cells to exhibit good solar cell characteristics. During firing, the inventive conductive paste can fire through antireflection films made of materials such as silicon nitride.

In the conductive paste of the invention, the oxide(s) comprised in the glass frit may comprise silicon dioxide. When the oxide(s) in the glass frit comprises silicon dioxide, solar cells having good solar cell characteristics can be obtained reliably.

In the conductive paste of the invention, the oxide(s) comprised in the glass frit may comprise at least one selected from lead oxide and boron oxide. When the oxide(s) in the glass frit comprises at least one selected from lead oxide and boron oxide, solar cells having good solar cell characteristics can be obtained more reliably.

In the conductive paste of the invention, the content of the glass frit may be 1.5 to 10 parts by weight with respect to 100 parts by weight of the conductive powder. When the content of the glass frit is 1.5 to 10 parts by weight with respect to 100 parts by weight of the conductive powder, the contact resistance between the formed electrode and a crystalline silicon substrate can be reduced while the electrode exhibits desired conductive properties.

In the conductive paste of the invention, the conductive powder may be a silver powder. When the conductive powder is a silver powder with high conductivity, solar cells having good solar cell characteristics can be obtained more reliably.

A process for manufacturing solar cells according to the invention comprises the steps of printing the above conductive paste onto an n-type silicon layer of a crystalline silicon substrate or onto an antireflection film on the n-type silicon layer, and drying and firing the conductive paste to form an electrode. By the use of the conductive paste of the invention, the inventive solar cell manufacturing process can produce solar cells having good solar cell characteristics.

A solar cell of the invention is manufactured by the above manufacturing process. The solar cells obtained by the above process for manufacturing solar cells have good solar cell characteristics.

A process for producing conductive pastes for forming solar cell electrodes according to the invention comprises a step of measuring binding energies of oxygen in a glass frit by X-ray photoelectron spectroscopy, a step of selecting a glass frit giving an X-ray photoelectron spectrum representing binding energies of oxygen in which the signal intensity of a peak with a peak top at a range from 529 eV to less than 531 eV has a proportion of 40% or more relative to the total of signal intensities from 526 eV to 536 eV, and a step of mixing a conductive powder, the glass frit and an organic vehicle together. Conductive pastes obtained, by the inventive production process can form solar cell electrodes that allow solar cells to exhibit good solar cell characteristics.

In the inventive process for producing conductive pastes, the oxide(s) comprised in the glass frit may comprise silicon dioxide. When the oxide(s) in the glass frit comprises silicon dioxide, the obtainable conductive paste reliably allows for producing solar cells having good solar cell characteristics.

In the inventive process for producing conductive pastes, the oxide(s) comprised in the glass frit may comprise at least one selected from lead oxide and boron oxide. When the oxide(s) in the glass frit comprises at least one selected from lead oxide and boron oxide, the obtainable conductive paste reliably allows for producing solar cells having good solar cell characteristics.

In the inventive process for producing conductive pastes, the content of the glass frit may be 1.5 to 10 parts by weight with respect to 100 parts by weight of the conductive powder. When the content of the glass frit is in this range, the obtainable conductive paste more reliably allows for producing solar cells having good solar cell characteristics.

In the inventive production process, the conductive powder may be a silver powder. When the conductive powder is a silver powder with high conductivity, the obtainable conductive paste more reliably allows for producing solar cells having good solar cell characteristics.

The present invention provides guidelines for the selection of an appropriate composition of a glass frit in the production of conductive pastes for forming solar cell electrodes. Thus, it becomes possible to produce conductive pastes which can form satisfactory solar cell electrodes on n-type silicon layers of crystalline solar cells. According to the invention, conductive pastes can be obtained which can fire through antireflection films made of materials such as silicon nitride when the conductive pastes are fired.

The present invention will be described in detail hereinbelow.

In the present specification, the term "crystalline silicon" comprises monocrystalline silicon and polycrystalline silicon. The term "crystalline silicon substrates" refers to crystalline silicon formed into shapes such as plates suited for the formation of electric elements or electronic elements. Crystalline silicon may be formed by any methods. For example, the Czochralski process may be used for monocrystalline silicon, and a casting method may be utilized in the case of polycrystalline silicon. Crystalline silicon substrates produced by other methods may also be used, with examples including polycrystalline silicon ribbons fabricated by ribbon pulling methods, and polycrystalline silicon formed on different types of substrates such as glass. The term "crystalline silicon solar cells" refers to solar cells fabricated using crystalline silicon substrates. As an index of solar cell characteristics, fill factor (hereinafter, also "FF") is used which is obtained from measurement of current-voltage characteristics under irradiation of light.

The conductive paste for forming solar cell electrodes according to the invention comprises a conductive powder, a glass frit and an organic vehicle. The glass frit used in the inventive conductive paste comprises at least one oxide. The inventive conductive paste is characterized in that X-ray photoelectron spectroscopy (XPS) of the glass frit gives a spectrum representing binding energies of oxygen in which the signal intensity of a peak with a peak top at a range from 529 eV to less than 531 eV has a proportion of 40% or more relative to the total of signal intensities from 526 eV to 536 eV.

X-ray photoelectron spectroscopy (XPS) measures the energy of a photoelectron emitted by the application of an X-ray to the sample surface and thereby determines the binding energy of the electron (in the specification, simply referred to as "binding energy"). The binding energies of electrons are different and depending on the types of elements and the oxidation states. Thus, the measurement of binding energies enables the evaluation of oxidation states in the glass frits.

Figure 2:
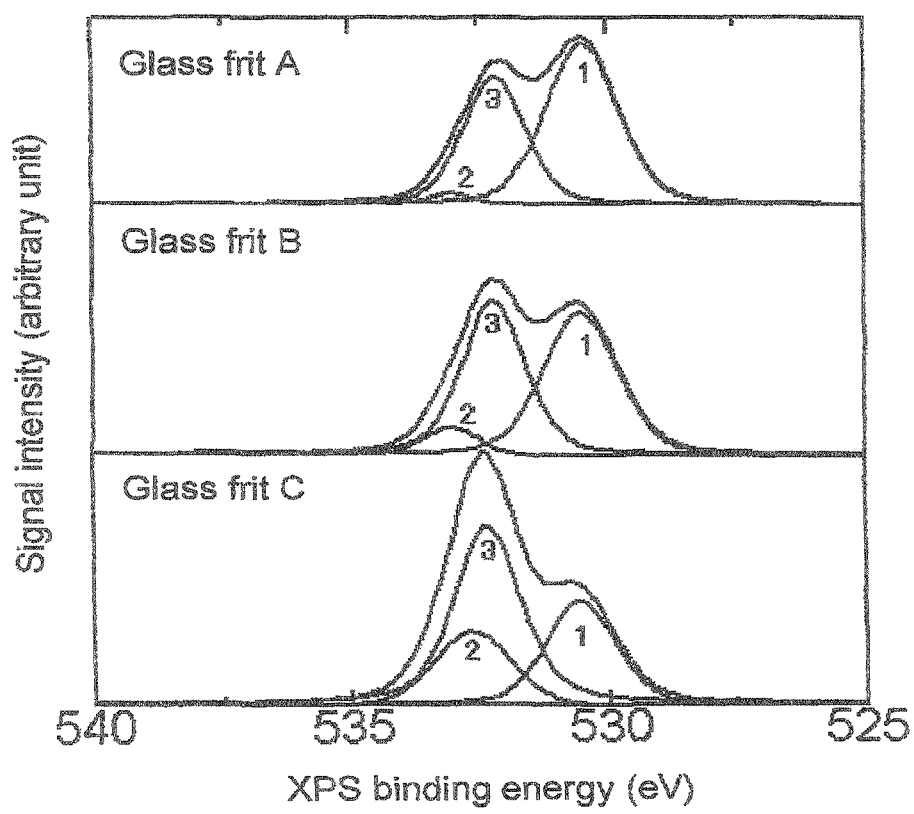
FIG. 2 is a diagram which indicates spectra of XPS signal intensities versus binding energies of glass frits A, B and C according to XPS measurement. The peak Nos. 1 to 3 represent respective separate peaks of XPS signals. The peak. No. 1 represents a peak of an XPS signal for low binding energy of oxygen, the peak No. 2 represents a peak of an XPS signal for Si—O—Si bonds, and the peak No. 3 represents a peak of an XPS signal for high binding energy of oxygen.
Figure 3:
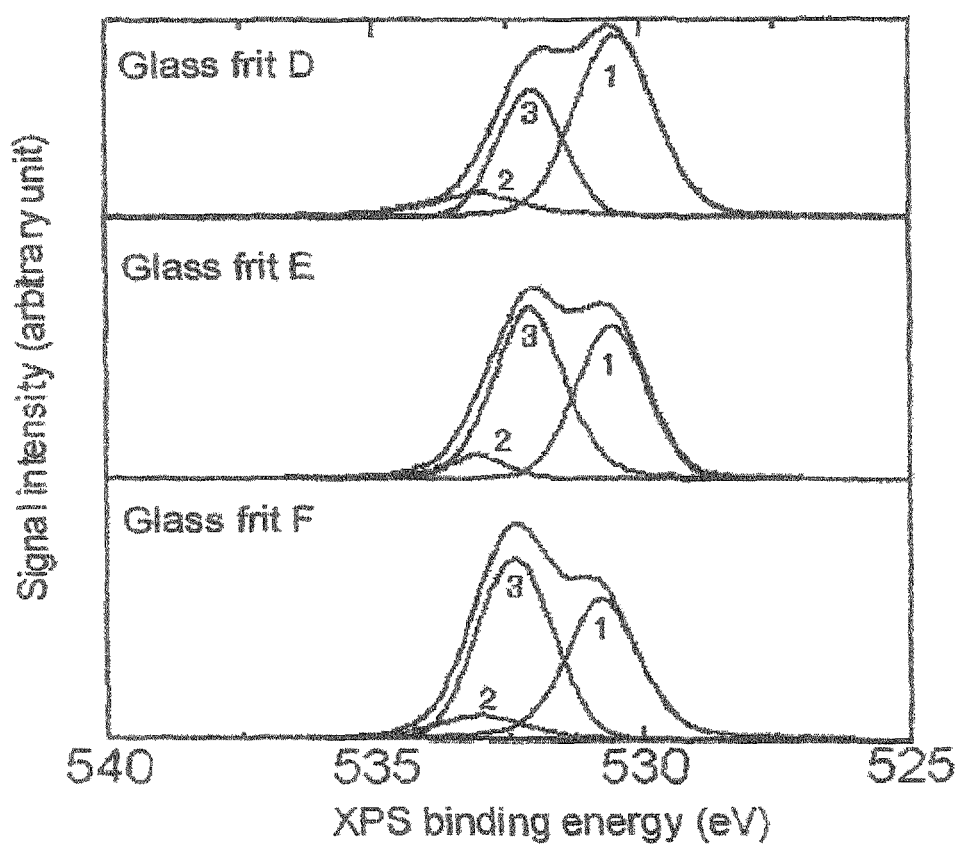
FIG. 3 is a diagram which indicates spectra of XPS signal intensities versus binding energies of glass frits D, E and F according to XPS measurement. The peak Nos. 1 to 3 represent respective separate peaks of XPS signals. The peak No. 1 represents a peak of an XPS signal for low binding energy of oxygen, the peak No. 2 represents a peak of an XPS signal for Si—O—Si bonds, and the peak No. 3 represents a peak of an XPS signal for high binding energy of oxygen.

As illustrated in FIGS. 2 and 3, XPS measurement of glass frits shows XPS signals representing binding energies of oxygen in the range from 526 eV to 536 eV. The XPS signals in the range from 526 eV to 536 eV in FIGS. 2 and 3 are considered to consist of the following three peaks. The first peak is given by an XPS signal with a peak top at a range from 529 eV to less than 531 eV (referred to as "XPS signal for low oxygen binding energy" and indicated as peak No. 1 in FIGS. 2 and 3). The second peak is given by an XPS signal for Si—O—Si bonds with a peak top at about 533 eV (referred to as "XPS signal for Si—O—Si bonds" and indicated as peak No. 2 in FIGS. 2 and 3). The third peak is given by an XPS signal with a peak top between the first and the second peaks (referred to as "XPS signal for high oxygen binding energy" and indicated as peak No. 3 in FIGS. 2 and 3).

XPS spectra in the range from 526 eV to 536 eV may be separated to the above three peaks by known techniques. The intensities of the above three XPS signals may be calculated by determining the areas of the respective peaks which are separated. The total of signal intensities from 526 eV to 536 eV is an integral value (an integral area) of intensities of signals observed in the entire range from 526 eV to 536 eV. XPS spectra may be processed by known techniques such as known noise or background correction.

The present inventors have found that glass frits having an X-ray photoelectron spectroscopy (XPS) spectrum representing binding energies of oxygen in which the signal intensity of a peak with a peak top at 529 eV to less than 531 eV (the intensity of an XPS signal for low oxygen binding energy) has a proportion of 40% or more, preferably 55% or more, and more preferably 60% or more relative to the total of signal intensities from 526 eV to 536 eV can be suitably added to conductive pastes for forming crystalline solar cell electrodes, thus completing the invention. As long as the intensity of an XPS signal for low oxygen binding energy has the above specific proportion, the glass frit can be suitably added to conductive pastes for forming crystalline solar cell electrodes regardless of the elements present in the glass frit.

According to the present invention, a suitable glass frit can be selected without fabricating prototype solar cells utilizing various conductive pastes for forming an electrode. Consequently, conductive pastes suitable for the production of electrodes in crystalline solar cells can be produced at low development costs.

The main component of the conductive powder used in the inventive conductive paste may be a conductive material, for example, a metal material. The conductive paste for forming an electrode preferably contains a silver powder as the conductive powder. The inventive conductive paste may contain a metal powder other than silver or a silver alloy powder as long as the performances of solar cell electrodes are not deteriorated. However, it is preferable that the conductive powder consist of a silver powder in order to obtain low electric resistance and high reliability.

The particle shapes and particle sizes of the conductive powder are not particularly limited. The particle shapes may be, for example, spheres and scales. The particle size refers to the largest length of a particle. From viewpoints such as workability, the particle sizes of the conductive powder are preferably 0.05 to 20 μm, and more preferably 0.1 to 5 μm.

In general, fine particles have a certain size distribution. It is therefore not necessary that all the particles have the above particle size. The median (50%) particle size (D50) of all the particles is preferably in the above range of particle sizes. Alternatively, the average of the particle sizes (the average particle size) may be in the above range. The same applies to sizes of particles other than the conductive powder which are described in the present specification. The median particle diameter may be determined by analyzing particle size distribution according to a Microtrac method (a laser diffraction scattering method) and obtaining a D50 value from the results of the particle size distribution analysis.

The size of the conductive powder may be expressed in terms of BET value (BET specific surface area). The BET value of the conductive powder is preferably 0.1 to 5 $m^2/g$, and more preferably 0.2 to 2 $m^2/g$.

The glass frit used in the inventive conductive paste comprises at least one oxide. In the inventive conductive pastes, types and contents of oxides present in the glass frit are selected such that the glass frit has an XPS spectrum representing binding energies of oxygen in which the signal intensity of a peak with a peak top at 5.29 eV to less than 531 eV has a proportion of 40% or more, preferably 55% or more, and more preferably 60% or more relative to the total of signal intensities from 526 eV to 536 eV. The types of oxides present in the glass frit used in the inventive conductive paste are not particularly limited.

The glass frit present in the inventive conductive paste preferably comprises silicon dioxide ($SiO_2$). The $SiO_2$ content in the glass frit is preferably 10 to less than 50 mol %, more preferably 15 to 45 mol %, and still more preferably 20 to 40 mol %. This $SiO_2$ content in the glass frit ensures that crystalline silicon solar cells with good solar cell characteristics can be obtained reliably.

In the inventive conductive paste, it is preferable that the oxide(s) present in the glass frit comprise at least one selected from lead oxide (PbO) and boron oxide ($B_2O_3$).

A Pb-containing glass frit or a Pb-free glass frit may be used as the glass frit in the conductive paste of the present invention for forming an electrode. However, a glass frit containing PbO is preferably used in order to obtain crystalline silicon solar cells with higher conversion efficiency by utilizing the inventive conductive paste. In order to reliably obtain crystalline silicon solar cells with higher conversion efficiency, the PbO content in the glass frit is preferably 50 to 90 mol %, and more preferably 50 to 70 mol %.

The $B_2O_3$ content in the glass frit is 0 to 40 mol %, preferably 0 to 15 mol %, and more preferably 0 to 5 mol %. This $B_2O_3$ content in the glass frit ensures that crystalline silicon solar cells with good solar cell characteristics can be obtained reliably.

As long as the signal intensity of the specific XPS peak has the specific proportion, the glass frit in the inventive conductive paste may contain any oxides other than the above oxides. For example, the glass frit in the inventive conductive paste may contain at least one selected from oxides such as $Bi_2O_3$, BaO, $Al_2O_3$, $P_2O_5$, CaO, MgO, $V_2O_5$, $ZrO_2$, $TiO_2$, $Li_2O_3$, $Na_2O_3$, $MoO_3$, ZnO, $CeO_2$, $SnO_2$ and SrO.

The shapes of particles of the glass frit are not particularly limited. Exemplary shapes of particles of the glass frit comprise spheres and amorphous shapes. The particle sizes are not particularly limited. However, from viewpoints such as workability, the median value (D50) of the particle sizes is preferably in the range from 0.1 to 10 μm, and more preferably in the range from 0.5 to 5 μm.

In the inventive conductive paste, the content of the glass frit is preferably 1.5 to 10 parts by weight, more preferably 1.5 to 6 parts by weight, and still more preferably 1.5 to 5 parts by weight with respect to 100 parts by weight of the conductive powder. This content of the glass frit in the conductive paste ensures that solar cells with good solar cell characteristics can be obtained reliably.

In order for the glass frit to exhibit appropriate softening performance during firing of the inventive conductive paste, the softening point of the glass frit is preferably 300 to 700° C., more preferably 400 to 600° C., and still more preferably 500 to 580° C.

The inventive conductive paste comprises an organic vehicle. The organic vehicle may comprise an organic binder and a solvent. The organic binder and the solvent are used for purposes such as controlling the viscosity of the conductive paste, and they are not particularly limited. They may be used as a solution of the organic binder in the solvent.

The organic binder may be selected from cellulose resins (such as ethylcellulose and nitrocellulose) and (meth)acrylic resins (such as polymethyl acrylate and polymethyl methacrylate). The amount of the organic binders added is usually 0.2 to 30 parts by weight, and preferably 0.4 to 5 parts by weight with respect to 100 parts by weight of the conductive powder.

One, or two or more kinds of solvents may be selected from alcohols (such as terpineol, α-terpineol and β-terpineol) and esters (such as hydroxyl group-containing esters, 2,2,4-trimethyl-1,3-pentanediol monoisobutyrate and butylcarbitol acetate). The amount of the solvents added is usually 0.5 to 30 parts by weight, and preferably 5 to 25 parts by weight with respect to 100 parts by weight of the conductive powder.

Further, the inventive conductive paste may contain additives as required selected from those additives such as plasticizers, antifoaming agents, dispersants, leveling agents, stabilizers and adhesion promoters. The plasticizers may be selected from, for example, phthalate esters, glycolate esters, phosphate esters, sebacate esters, adipate esters and citrate esters.

The inventive conductive paste may contain additive particles other than those described above as long as the solar cell characteristics of the obtainable solar cells are not adversely affected. For example, the inventive conductive paste may contain a zinc oxide powder. When the inventive conductive paste contains a zinc oxide powder, the content thereof is 2 to 5 parts by weight, preferably 3 to 4.7 parts by weight, and more preferably 3.5 to 4.5 parts by weight with respect to 100 parts by weight of the conductive powder. This content of the zinc oxide powder in the inventive conductive paste ensures that crystalline silicon solar cells with good solar cell characteristics can be obtained.

Next, a process for producing conductive pastes according to the invention will be described.

The process for producing conductive pastes according to the invention has a step of measuring binding energies of oxygen in a glass frit by X-ray photoelectron spectroscopy (XPS).

When a glass frit is analyzed by XPS, XPS signals representing binding energies of oxygen are observed in the range from 526 eV to 536 eV. Accordingly, the XPS measurement is preferably carried out at least in the range including 526 eV to 536 eV. The XPS measurement may be performed according to a known method.

The inventive process for producing conductive pastes has a step of selecting a glass frit giving an X-ray photoelectron spectrum representing binding energies of oxygen in which the signal intensity of a peak with a peak top at a range from 529 eV to less than 531 eV has a proportion of 40% or more relative to the total of signal intensities from 526 eV to 536 eV.

As illustrated in FIGS. 2 and 3, glass frits which are mixtures of different oxides give XPS binding energy spectra in which a plurality of peaks overlap with one another. An XPS spectrum in the range from 526 eV to 536 eV may be separated into several peaks by a known technique. At least a peak(s) with a peak top at 529 eV to less than 531 eV is separated, and the proportion of such a peak relative to the total of signal intensities from 526 eV to 536 eV is calculated. By selecting a glass frit having a 40% or higher proportion, a conductive paste with excellent performance can be obtained. The total of signal intensities from 526 eV to 536 eV is an integral value of intensities of signals observed in the entire range from 526 eV to 536 eV. In detail, the proportion relative to the total of signal intensities from 526 eV to 536 eV may be obtained as the proportion of the area of the separated peak(s) relative to the area of the entirety of the spectrum in the range from 526 eV to 536 eV.

The inventive process for producing conductive pastes has a step of mixing a conductive powder, the glass frit and an organic vehicle together. The conductive paste of the invention may be produced by adding a conductive powder, the glass frit selected in the above manner, and optionally other additives and additive particles to an organic binder and a solvent, and mixing and dispersing these components.

For example, the components may be mixed with a planetary mixer and may be dispersed with a three-roll mill. The mixing and dispersing methods are not limited thereto and may be any of various known methods.

In the inventive production process, the oxide(s) present in the glass frit preferably comprises silicon dioxide. It is also preferable that the oxide(s) present in the glass frit comprise at least one selected from lead oxide and boron oxide. The content of the glass frit is preferably 1.5 to 10 parts by weight with respect to 100 parts by weight of the conductive powder. The conductive powder is preferably a silver powder.

Next, there will be described a process for manufacturing crystalline silicon solar cells utilizing the inventive conductive paste. The manufacturing process of the invention comprises the steps of printing the inventive conductive paste onto an n-type silicon layer of a crystalline silicon substrate or onto an antireflection film on the n-type silicon layer, and drying and firing the conductive paste to form an electrode. Hereinbelow, the process for manufacturing solar cells according to the invention will be described in greater detail with reference to FIG. 1.

FIG. 1 is a schematic cross sectional view of a portion of a crystalline silicon solar cell in the vicinity of a front electrode 1. The crystalline silicon solar cell illustrated in FIG. 1 has the front electrode 1 disposed on the light incident side, an antireflection film 2, an n-type diffusion layer (an n-type silicon layer) 3, a p-type silicon substrate 4 and a back electrode 5.

In the inventive process for manufacturing solar cells, the inventive conductive paste may be used to form a front electrode and/or a back electrode of a solar cell substrate. In detail, the inventive process for manufacturing solar cells comprises a step of printing the inventive conductive paste onto an n-type silicon layer 3 of a crystalline silicon substrate (for example, a p-type silicon substrate 4) or onto an antireflection film 2 on the n-type silicon layer 3.

The inventive conductive paste may also be used to form an electrode on the surface of a p-type silicon layer. In order to achieve a greater reduction in contact resistance between a substrate and the electrode and thereby to obtain a crystalline silicon solar cell exhibiting higher performance, the inventive conductive paste is suitably used to form an electrode on the surface of an n-type silicon layer 3.

FIG. 1 illustrates an embodiment in which the inventive conductive paste is used to form a front electrode 1. However, the inventive conductive paste may be used to form any of a front electrode 1 and a back electrode 5. That is, the inventive conductive paste may be used to form an electrode on the surface of n-type silicon on the backside of an n-type silicon substrate.

When the inventive conductive paste is used to form a front electrode 1 on a monocrystalline or polycrystalline silicon solar cell substrate, the conductive paste may be printed directly onto an n-type silicon layer of the silicon substrate or may be printed onto an antireflection film 2 on the n-type diffusion layer (the n-type silicon layer) 3. When the inventive conductive paste is printed onto the antireflection film 2, the conductive paste fires through the antireflection film 2 during subsequent firing to form a front electrode 1 on the n-type diffusion layer 3.

To obtain high conversion efficiency; the surface of the crystalline silicon substrate on the light incident side preferably has a pyramid-shaped texture structure.

For the production of a solar cell with a structure illustrated in FIG. 1, the inventive conductive paste may be printed onto a crystalline silicon substrate having an n-type diffusion layer 3 on its surface or onto an antireflection film 2 disposed on the n-type diffusion layer 3 by a method such as screen printing to form an electrode pattern.

The inventive process for manufacturing solar cells comprises steps of drying and firing the conductive paste for forming an electrode printed as described above. In detail, the printed electrode pattern is dried at a temperature of about 100 to 150° C. for several minutes (for example, 0.5 to 5 minutes). The inventive conductive paste or another conductive paste (for example, a conductive paste containing aluminum as the main component) is printed onto substantially the entirety of the backside and is dried under similar conditions.

Thereafter, the dried conductive pastes are fired in air using a firing furnace such as a tubular furnace at a temperature of about 500 to 850° C. for 0.4 to 3 minutes to form a front electrode 1 on the light incident side as well as a back electrode 5. In detail, the firing time from the inlet to the outlet from the firing furnace may be 0.5 minutes. When the inventive conductive paste has been printed on the antireflection film 2, the paste material brought to a high temperature fires through the antireflection film 2 during firing. As a result, the front electrode 1 can be electrically connected to the n-type diffusion layer 3 on the silicon substrate. In this manner, a solar cell with a structure illustrated in FIG. 1 may be obtained. The firing conditions are not limited to those described above and may be selected appropriately.

The inventive conductive paste may be suitably used for electrode formation on n-type silicon layers even for back contact solar cells as well as for solar cells in which light incident-side electrodes are conductively connected to the backside via through holes formed in the substrates.

While the present invention has been illustrated based on solar cells having p-type silicon substrates, the invention is applicable to the manufacturing of crystalline silicon solar cells with n-type silicon substrates using the inventive conductive paste by similar processes only except that p-type diffusion layers are formed in place of the n-type diffusion layers by doping the diffusion layers with p-type impurities such as boron instead of n-type impurities such as phosphorus.

EXAMPLES

Hereinbelow, the present invention will be described in detail by presenting examples without limiting the scope of the invention to such examples.

⟨ Materials of Conductive Pastes and Proportions in Preparation⟩

Compositions of conductive pastes used for the production of solar cells in examples and comparative examples are as follows.

Conductive powder: Spherical Ag particles (100 parts by weight) were used which had a BET value of 0.6 m²/g and a median particle diameter D50 of 1.4 μm.

Glass frits: Glass frits A to H with the compositions shown in Table 1, were used. Table 2 shows the amounts of the glass frits added to 100 parts by weight of the conductive powder in the conductive pastes of examples and comparative examples. The median particle diameter D50 of the glass frits was 2 μm.

Organic binder: Ethylcellulose (1 part by weight) containing 48 to 49.5 wt % of ethoxy was used.

Solvent: Butylcarbitol (11 parts by weight) was used.

The above materials were mixed together at the specified proportions using a planetary mixer and were dispersed with a three-roll mill to give a conductive paste.

⟨Fabrication of Prototype Solar Cells⟩

To evaluate the inventive conductive pastes, prototype solar cells were fabricated using the conductive pastes prepared above and their characteristics were measured. Prototype solar cells were fabricated as follows.

A boron (B)-doped p-type monocrystalline Si substrate (substrate thickness: 200 μm) was used as the substrate.

First, the substrate was dry oxidized to form a silicon oxide layer with a thickness of about 20 μm. Thereafter, the surface was etched with a mixture solution containing hydrogen fluoride, pure water and ammonium fluoride, thereby removing damages on the substrate surface. Further, heavy metal cleaning was performed using an aqueous solution containing hydrochloric acid and hydrogen peroxide.

Thereafter, the substrate surface was wet etched to form a texture (a concavo-convex structure). In detail, a pyramid-shaped texture structure was formed on one side (the surface on the light incident side) by a wet etching method (using an aqueous sodium hydroxide solution). The surface was then cleaned with an aqueous solution containing hydrochloric acid and hydrogen peroxide.

Next, phosphorus was diffused into the texture surface of the substrate by a diffusion method using phosphorus oxychloride ($POCl_3$) at 950° C. for 30 minutes. Thus, an n-type diffusion layer was formed with a depth of about 0.5 μm. The sheet resistance of the n-type diffusion layer was 60 Ω/sq (ohms per square).

Next, a silicon nitride thin film was formed with a thickness of about 60 nm on the surface of the n-type diffusion layer by a plasma CVD method using silane gas and ammonia gas. In detail, a mixture gas ($NH_3/SiH_4$=0.5) at 1 Torr (133 Pa) was decomposed by glow discharge and thereby a silicon nitride thin film (an antireflection film) was formed with a film thickness of about 60 nm by a plasma CVD method.

The solar cell substrate obtained, above was cut to 15 mm×15 mm squares.

To form an electrode on the light incident side (the front side), the conductive paste was printed by a screen printing method. The conductive paste was printed onto the antireflection film of the substrate to create an approximately 20 μm thick pattern consisting of a 2 mm square bus electrode section and six finger electrode sections each with 100 μm width. The pattern was dried at 150° C. for about 60 seconds.

To form a back electrode, a conductive paste was printed by a screen printing method. In detail, a conductive paste based on aluminum particles, a, glass frit, ethylcellulose and a solvent was printed onto a 14 mm square region on the backside of the above substrate. The paste was then dried at 150° C. for about 60 seconds. The dried conductive paste for the back electrode had a film thickness of about 20 μm.

The substrate printed with the conductive pastes on both sides was fired in air under specific conditions using a near infrared firing furnace having a halogen lamp as the heat source (a high speed firing test furnace for solar cells, manufactured by NGK INSULATORS, LTD.). The firing conditions were such that the peak temperature was 720° C., and the both sides were fired simultaneously in air for an inlet to outlet time of 30 seconds. Prototype solar cells were fabricated in the above manner.

⟨Measurement of Solar Cell Characteristics⟩

Electric characteristics of the solar cells were measured as follows. To evaluate current-voltage characteristics, the prototype solar cells were operated under the irradiation of solar simulator light (AM 1.5, energy density 100 mW/cm²). From the measurement results, the fill factor (FF), the conversion efficiency (%) and the series resistance Rs (Ω) were calculated. Two identical prototype cells were fabricated, and the averages of the measured values of the two prototype cells were obtained.

⟨X-Ray Photoelectron Spectroscopy⟩

To evaluate binding energies of oxygen of the glass frits, the glass frits were analyzed by X-ray photoelectron spectroscopy (XPS). In detail, the glass frit alone was formed into a paste using butylcarbitol, and the paste was printed to the backside of a silicon substrate for a solar cell and was dried at 150° C. for 60 seconds. The dried film was fired by heating at a peak temperature of 700° C., thereby fabricating a glass frit sample. The glass frit sample was analyzed to measure the intensities of XPS signals in the range of binding energies including 526 eV to 536 eV. PHI Quantera SXM manufactured by ULVAC-PHI, INCORPORATED was used as the X-ray photoelectron spectrometer. In the XPS measurement, the shifts of the peaks were corrected with the peak of carbon as the reference.

The peaks in the obtained XPS spectrum were separated, and oxidation states with different binding energies were evaluated. In detail, the peaks were separated into three peaks: a peak given by an XPS signal with a peak top at 529 eV to less than 531 eV, referred to as "XPS signal for low oxygen binding energy"; a peak given by an XPS signal with a peak top at 533 eV, referred to as "XPS signal for Si—O—Si bonds"; and a peak given by an XPS signal with a peak top at around 532 eV other than the above two peaks, referred to as "XPS signal for high oxygen bin dig energy". The intensities of XPS signals representing binding energies of oxygen were determined by calculating the areas of the respective peaks which had been separated. The total of signal intensities from 526 eV to 536 eV is the total of the XPS signal intensities of the above three peaks. Next, the proportions of the XPS signal intensities at the respective binding energies were calculated relative to the total of signal intensities from 526 eV to 536 eV. Separately, pure $SiO_2$ (quartz) was analyzed by XPS beforehand to compare to the intensity of "XPS signal for Si—O—Si bonds". As a result, the binding energy of the oxygen atoms (Si—O—Si bonds) was determined to be about 533 eV.

⟨Experiments 1 to 8⟩

Prototype solar coils of Experiments 1 to 8 were fabricated by the procedures described above while forming front electrodes with conductive pastes which contained the glass frits A to H described in Table 1 in the amounts shown in Table 2. Table 2 describes the results of measurement of the fill factors (FF) of these solar cells.

The glass frits A to H described in Table 1 were analyzed with the X-ray photoelectron spectrometer to measure the intensities of XPS signals representing binding energies of oxygen. Table 2 describes the proportions of the intensities of the XPS signals for low oxygen binding energy, high oxygen binding energy and Si—O—Si bonds. FIG. 2 indicates spectra of XPS signal intensities versus binding energies of the glass frits A, B and C according to the XPS measurement. FIG. 3 indicates spectra of XPS signal intensities versus binding energies of the glass frits D, E and F according to the XPS measurement. The spectra shown in FIGS. 2 and 3 reflect the results of peak separation carried but with respect to the obtained spectra. In FIGS. 2 and 3, the peak No. 1 represents the XPS signal for low binding energy of oxygen, the peak No. 2 represents the XPS signal for Si—O—Si bonds, and the peak No. 3 represents the XPS signal for high binding energy of oxygen.

As shown in Table 2, Experiments 3 and 8 in which the intensity of the XPS signal for low oxygen binding energy represented less than 40% are comparative examples, the other experiments are the examples of the present invention.

Figure 4:
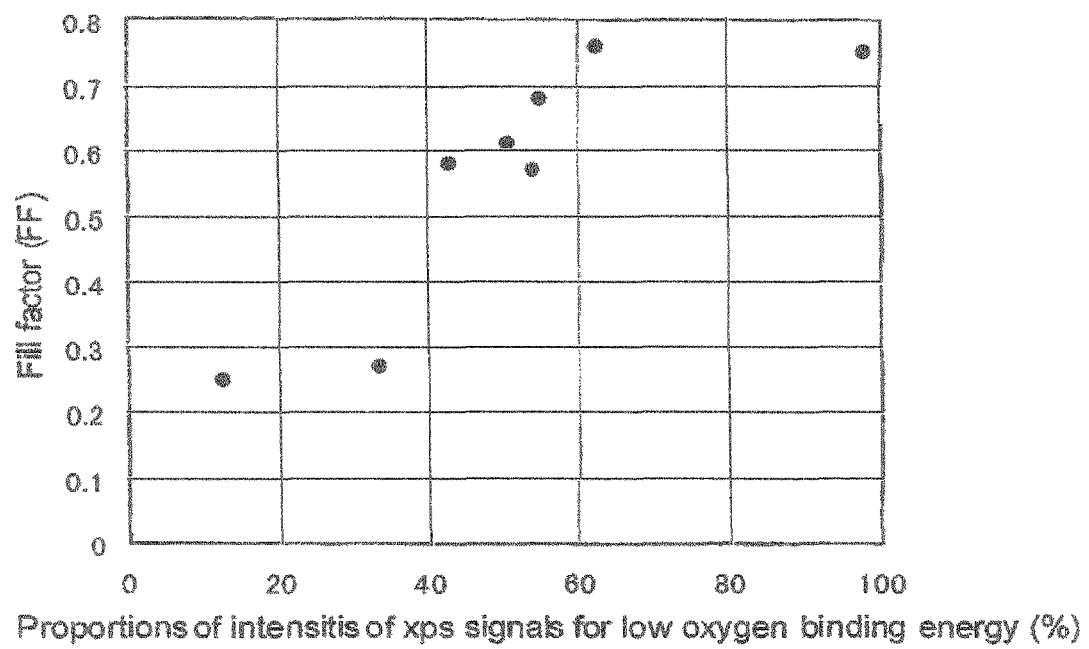
FIG. 4 is a diagram indicating a relationship between the proportions of the intensities of an XPS signals for low binding energy of oxygen, and the fill factors (FFs) in Experiments 1 to 8.

FIG. 4 illustrates a relationship between the proportion of the intensity of the XPS signal for low binding energy of oxygen, and the fill factor (FF) according to the results described in Table 2. As shown in FIG. 4, the use of the glass frits with less than 40% proportion of the intensity of the XPS signal for low oxygen binding energy resulted in solar cells exhibiting a fill factor (FF) as low as 0.27 or less. In contrast, when the proportion of the intensity of the XPS signal for low oxygen binding energy was 40% or more, the fill factor (FF) was markedly increased to 0.57 or above. That is, a critical significance lies in whether the proportion of the intensity of an XPS signal for low oxygen binding energy is 40% or above.

As shown in FIG. 4, the solar cells achieved a higher fill factor (FF) of 0.68 or above in Experiments 1, 4 and 7 in which the proportion of the intensity of the XPS signal for low oxygen binding energy was 55% or more. Further, the solar cells achieved a still higher fill factor (FF) of 0.75 or above in Experiments 1 and 7 in which the proportion of the intensity of the XPS signal for low oxygen binding energy was 60% or more. These results show that the proportion of the intensity of an XPS signal for low oxygen binding energy is more preferably 55% or more, and still more preferably 60% or more in order to obtain solar cells exhibiting a higher fill factor (FF).

TABLE 1

| | Exp. 1 | Exp. 2 | Exp. 3 | Exp. 4 | Exp. 5 | Exp. 6 | Exp. 7 | Exp. 8 |
| --- | --- | --- | --- | --- | --- | --- | --- | --- |
| Proportions (mol %) | Glass frit A | Glass frit B | Glass frit C | Glass frit D | Glass frit E | Glass frit F | Glass frit G | Glass frit H |
| PbO | 70 | 60 | 50 | 70 | 60 | 50 | 63 | 33 |
| $SiO_2$ | 30 | 40 | 50 | 20 | 30 | 40 | 28 | 51 |
| $B_2O_3$ | 0 | 0 | 0 | 10 | 10 | 10 | 0 | 16 |
| $Al_2O_3$ | 0 | 0 | 0 | 0 | 0 | 0 | 7 | 0 |
| $P_2O_5$ | 0 | 0 | 0 | 0 | 0 | 0 | 2 | 0 |
| Total | 100 | 100 | 100 | 100 | 100 | 100 | 100 | 100 |

TABLE 2

| | Exp. 1 | Exp. 2 | Exp. 3 | Exp. 4 | Exp. 5 | Exp. 6 | Exp. 7 | Exp. 8 |
| --- | --- | --- | --- | --- | --- | --- | --- | --- |
| Silver (parts by weight) | 100 | 100 | 100 | 100 | 100 | 100 | 100 | 100 |
| Glass frit (parts by weight) | 2 | 2 | 2 | 2 | 2 | 2 | 2 | 2 |
| Organic binder (parts by weight) | 1 | 1 | 1 | 1 | 1 | 1 | 1 | 1 |
| Solvent (parts by weight) | 11 | 11 | 11 | 11 | 11 | 11 | 11 | 11 |
| Proportion of intensity of XPS signal for low oxygen binding energy (%) | 62.5 | 54.1 | 33.4 | 55.2 | 50.7 | 42.9 | 98 | 12.5 |
| Proportion of intensity of XPS signal for high oxygen binding energy (%) | 33.9 | 38.2 | 32.7 | 41.6 | 47 | 46.3 | 2 | 87.5 |
| Proportion of intensity of XPS signal for Si—O—Si bonds (%) | 3.6 | 7.7 | 33.9 | 3.2 | 2.4 | 10.8 | 0 | 0 |
| Fill factor (FF) | 0.76 | 0.57 | 0.27 | 0.68 | 0.61 | 0.58 | 0.75 | 0.25 |

NUMERAL REFERENCES

1 LIGHT INCIDENT-SIDE ELECTRODE (FRONT ELECTRODE)
2 ANTIREFLECTION FILM
3 N-TYPE DIFFUSION LAYER (N-TYPE SILICON LAYER)
4 P-TYPE SILICON SUBSTRATE
5 BACK ELECTRODE

The invention claimed is:

1. A process for producing a conductive paste for forming a solar cell electrode, comprising:
   (a) preparing a glass frit comprising silicon oxide and 50 to 70 mol % of lead oxide,
   (b) measuring binding energies of oxygen in the glass frit by X-ray photoelectron spectroscopy,
   (c) determining that an X-ray photoelectron spectrum representing the binding energies of oxygen in the glass frit has a signal intensity of a peak with a peak top at a range from 529 eV to less than 531 eV that has a proportion of 40% or more relative to the total of signal intensities from 526 eV to 536 eV, and
   (d) mixing together a conductive powder, the glass frit and an organic vehicle, after determining that the X-ray photoelectron spectrum representing the binding energies of oxygen in the glass frit has the signal intensity of the peak with the peak top at the range from 529 eV to less than 531 eV that has the proportion of 40% or more relative to the total of signal intensities from 526 eV to 536 eV.

2. The process according to claim 1, wherein the glass frit further comprises boron oxide.

3. The process according to claim 1, wherein the glass frit is in an amount of 1.5 to 10 parts by weight with respect to 100 parts by weight of the conductive powder.

4. The process according to claim 1, wherein the conductive powder is a silver powder.

5. The process according to claim 1, wherein the glass frit has a particle size in a range from 0.5 to 5 μm.

6. The process according to claim 1, wherein the glass frit has a softening point of 400 to 600° C.

7. The process according to claim 1, wherein the glass frit has an X-ray photoelectron spectrum representing binding energies of oxygen in which the signal intensity of the peak with the peak top at the range from 529 eV to less than 531 eV has a proportion of 55% or more relative to the total of signal intensities from 526 eV to 536 eV.

8. The process according to claim 1, wherein the glass frit has an X-ray photoelectron spectrum representing binding energies of oxygen in which the signal intensity of the peak with the peak top at the range from 529 eV to less than 531 eV has a proportion of 60% or more relative to the total of signal intensities from 526 eV to 536 eV.

9. The process according to claim 1, wherein the conductive powder has a particle size in the range from 0.05 to 20 μm.

10. The process according to claim 1, wherein of the conductive powder has a BET value of 0.1 to 5 m$^2$/g.

11. The process according to claim 1, wherein the silicon oxide in the glass frit is in an amount of 10 to 50 mol %.

12. The process according to claim 1, wherein the silicon oxide in the glass frit is in an amount of 15 to 45 mol %.

13. The process according to claim 1, wherein the silicon oxide in the glass frit is in an amount of 20 to 40 mol %.

14. The process according to claim 1, wherein the glass frit is in an amount of 1.5 to 6 parts by weight with respect to 100 parts by weight of the conductive powder.

15. The process according to claim 1, wherein the glass frit is in an amount of 1.5 to 5 parts by weight with respect to 100 parts by weight of the conductive powder.

16. The process according to claim 1, wherein the glass frit has a softening point of 500 to 580° C.

17. The process according to claim 1, wherein the organic vehicle comprises an organic binder and a solvent.

18. The process according to claim 17, wherein the organic binder is in an amount of 0.2 to 30 parts by weight with respect to 100 parts by weight of the conductive powder.

19. The process according to claim 17, wherein the solvent is in an amount of 0.5 to 30 parts by weight with respect to 100 parts by weight of the conductive powder.

* * * * *